(12) United States Patent
Chang et al.

(10) Patent No.: US 6,884,669 B2
(45) Date of Patent: Apr. 26, 2005

(54) HATTED POLYSILICON GATE STRUCTURE FOR IMPROVING SALICIDE PERFORMANCE AND METHOD OF FORMING THE SAME

(75) Inventors: Chih-Wei Chang, Hsin-Chu (TW); Mei-Yun Wang, Hsin-Chu (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 0 days.

(21) Appl. No.: 10/894,542

(22) Filed: Jul. 19, 2004

(65) Prior Publication Data

US 2004/0259342 A1 Dec. 23, 2004

Related U.S. Application Data

(62) Division of application No. 10/347,007, filed on Jan. 17, 2003, now abandoned.

(51) Int. Cl.[7] .............................................. H01L 21/336
(52) U.S. Cl. ...................... 438/182; 438/574; 438/578; 438/579; 438/666
(58) Field of Search ................................ 438/157, 182, 438/184, 303, 573–579, 585, 592, 595, 655, 666, 669, 673

(56) References Cited

U.S. PATENT DOCUMENTS

| | | |
|---|---|---|
| 5,100,820 A | 3/1992 | Tsubone |
| 5,780,896 A | 7/1998 | Ono |
| 5,937,299 A | 8/1999 | Michael et al. |
| 6,159,781 A | 12/2000 | Pan et al. |
| 6,197,645 B1 | 3/2001 | Michael et al. |
| 6,204,133 B1 | 3/2001 | Yu et al. |
| 6,214,680 B1 | 4/2001 | Quek et al. |
| 6,326,290 B1 | 12/2001 | Chiu |
| 6,350,688 B1 | 2/2002 | Liu et al. |
| 6,524,916 B1 | 2/2003 | Scholer et al. |
| 6,630,712 B1 | 10/2003 | Yu |
| 2002/0019119 A1 | 2/2002 | Saigal et al. |
| 2002/0064918 A1 | 5/2002 | Lee et al. |

FOREIGN PATENT DOCUMENTS

JP     PCT/JP95/00592     3/1995

*Primary Examiner*—Amir Zarabian
*Assistant Examiner*—Khanh Duong
(74) *Attorney, Agent, or Firm*—Duane Morris LLP

(57) ABSTRACT

Alternate methods of forming low resistance "hatted" polysilicon gate elements are provided that increase the effective area in the polysilicon gate for silicide grain growth during silicide formation. The expanded top portion helps to prevent silicide agglomeration in the silicide regions, thereby maintaining or reducing electrode resistance, improving high-frequency performance, and reducing gate delay in sub micron FET ULSI devices, without increasing the underlying active channel length.

22 Claims, 6 Drawing Sheets

HATTED POLYSILICON GATE STRUCTURE FOR IMPROVING SALICIDE PERFORMANCE AND METHOD OF FORMING THE SAME

CROSS-REFERENCE TO RELATED APPLICATION

This application is a divisional of U.S. patent application Ser. No. 10/347,007 filed Jan. 17, 2003 abandoned, the entirety of which is hereby incorporated by reference herein.

FIELD OF THE INVENTION

The present invention relates to fabrication of sub-micron FET semiconductor devices and more particularly to fabrication of salicided FET gate element structures.

BACKGROUND OF THE INVENTION

One process for forming contact regions in metal oxide semiconductor (MOS) devices is the self-aligned silicide (salicide) technique. A metal film is deposited over a MOS structure under processing conditions that result in the reaction of the metal with exposed silicon areas of the source and drain regions and of the polysilicon gate element to form low resistance metal silicide contact regions. An exemplary salicide process is outlined in Published U.S. patent application No. 2002/0019119 to Saigal et al., the entirety of which is hereby incorporated by reference herein.

As polysilicon gate line widths decrease toward 0.07 $\mu$m and below, silicide agglomeration begins to limit the salicide process capabilities, particularly with respect to N+ polysilicon gates. Specifically, the narrow line width effect causes an increase in the effective sheet resistance of the gate contact element and introduces difficulties in the fabrication process.

U.S. Pat. No. 6,326,290 to Chiu, issued Dec. 4, 2001, proposes two alternate gate electrode structures with expanded top portions, one generally having a T shaped polysilicon gate element and one generally having a Y shaped polysilicon gate element. While the expanded poly gate electrode structures reduce electrode effective sheet resistance, there still remains a need for a new method of forming such structures that utilizes popular damascene process techniques. Still further, alternative expanded structures and methods of forming the same are needed to provide added design flexibility for sub micron device architectures.

SUMMARY OF THE INVENTION

Alternate methods of forming a low resistance salicided polysilicon gate element of a FET device are provided. In a first method, a pair of vertical spacers are formed over a substrate defining a gate trench region having a gate dielectric layer formed therein. A blanket layer of polysilicon is deposited over the spacers and in the gate trench region. The deposited layer of polysilicon is then planarized and selectively etched to form a polysilicon gate element having a generally trapezoidal shaped polysilicon region over the gate trench, wherein a base of said trapezoidal region at least partially overlaps said spacers. A silicide contact is formed in the trapezoidal region.

In a second method of forming a low resistance salicided polysilicon gate element, an insulting layer formed over a substrate is etched to define a gate trench region of the transistor. The gate trench region has a gate dielectric formed therein. A blanket layer of polysilicon is deposited over the insulating layer and within the gate trench region. The polysilicon layer is then planarized. The planarized layer of polysilicon and the insulating layer are etched to form a generally T-shaped polysilicon gate element and a pair of vertical spacers that include a remaining portion of the insulating layer. The generally T-shaped polysilicon gate element at least partially overlaps the spacers. A silicide contact is then formed in the T-shaped polysilicon gate element.

The "hatted" polysilicon gate element increases the effective area in the polysilicon gate for silicide grain growth during silicide formation. The expanded top portion helps to prevent silicide agglomeration in the silicide regions, thereby maintaining or reducing electrode resistance, improving high-frequency performance, and reducing gate delay in sub micron FET ULSI devices, without increasing the underlying active channel length, i.e., the electrode length is expanded without expanding the control length. The process is generally compatible with conventional self-aligned gate processes and methods as well as damascene fabrication techniques.

The above and other features of the present invention will be better understood from the following detailed description of the preferred embodiments of the invention that is provided in connection with the accompanying drawings.

BRIEF DESCRIPTION OF THE DRAWINGS

The accompanying drawings illustrate preferred embodiments of the invention, as well as other information pertinent to the disclosure, in which.

DETAILED DESCRIPTION

Two alternate gate element structures are provided with expanded top portions to alleviate salicide agglomeration, thereby maintaining or reducing electrode resistance, improving high frequency performance and reducing gate delay in sub micron FET ULSI devices. Methods of forming the gate element structures are also provided.

Figure 1:
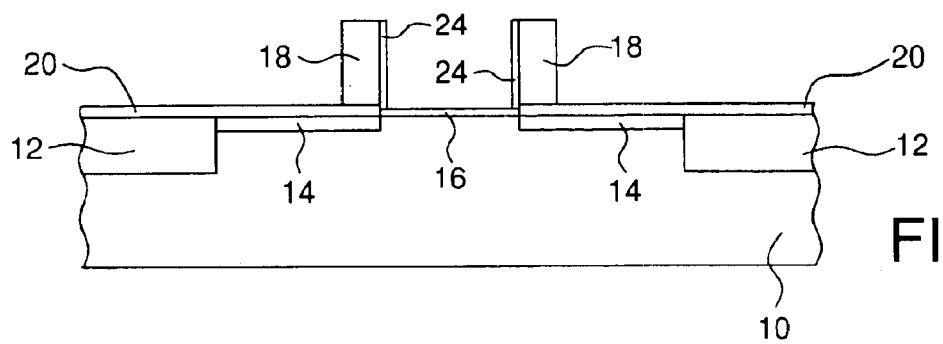
FIGS. 1–6 are cross-sections of a partially manufactured semiconductor device illustrating a first exemplary salicide method and structure for improving contact performance.

A first method of improving salicide contact performance and a salicided gate element structure of a field effect transistor (FET) are described in connection with FIGS. 1–6. Referring first to FIG. 1, a cross-section of a partially formed metal oxide semiconductor (MOS) FET is shown. A semiconductor device substrate 10, typically formed from monocrystalline silicon, is provided having shallow trench isolations 12 formed therein. Pad oxide layer 20 is formed thereover, typically to a thickness between about 100–300 Å, and lightly doped regions 14 are formed therein. A dummy or sacrificial polysilicon gate element can be used to mask the gate channel area during boron or phosphorous doping of the substrate 10 in the formation of lightly doped regions 14.

A layer of silicon nitride $Si_3N_4$ (sometimes referred to herein as SiN) or tetraethylorthosylicide (TEOS) is then deposited to a thickness of about 500–1200 Å, patterned and etched using known photolithographic techniques to form vertical side spacers 18 and to define the gate trench region therebetween. For transistors having channel lengths around 0.07 µm, an exemplary spacer 18 may have a width of approximately 0.06 µm. In one embodiment, the total width of the spacers and the channel length is between about 0.19–0.25 µm, assuming each spacer has a width of about 0.06 µm and the channel length is between about 0.07–0.13 µm.

A gate dielectric layer 16, which may include a silicon oxide layer having thickness between about 15–20 Å or a high-K dielectric materials such tantalum oxide ($Ta_2O_5$), titanium oxide ($TiO_2$), aluminum oxide ($Al_2O_3$), zirconium oxide ($ZrO_2$), hafnium oxide ($HfO_2$), yttrium oxide ($Y_2O_3$) or lanthanum oxide ($La_2O_5$), and their aluminates and silicates, is then formed in the gate trench region between the two vertical spacers 18. In one embodiment, a thin TEOS oxide or high-K oxide layer 24 may also, but not necessarily, be deposited on the inside surface of the spacers 18 or, alternatively, a high temperature diluted oxidation process may be used to form a very thin oxide on a SiN spacer 18.

Figure 2:
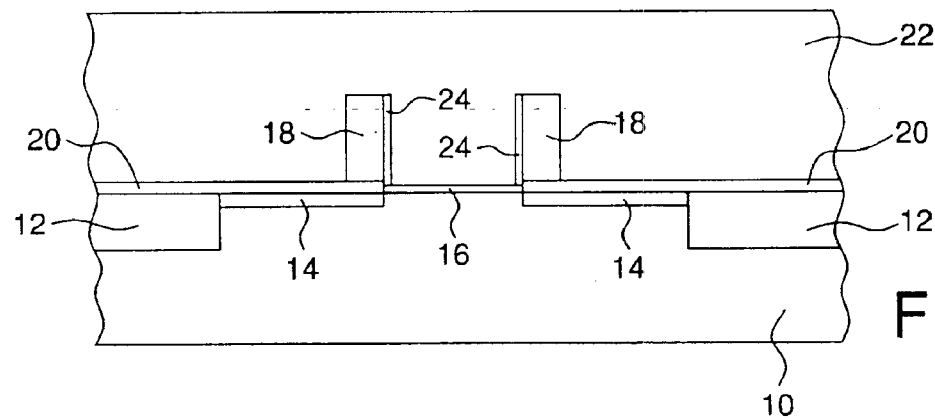

Once the structure of FIG. 1 is formed, a blanket layer of polysilicon 22 is deposited over the substrate 10, covering the vertical spacers 18 and filling the gate trench region as shown in FIG. 2. The polysilicon layer 22 is preferably deposited via a low pressure chemical vapor deposition (CVD) to a thickness between about 3000–8000 Å. The top surface of the polysilicon layer 22 is then planarized as shown in FIG. 2 by, for example, chemical mechanical polishing (CMP) thereof.

Figure 3:
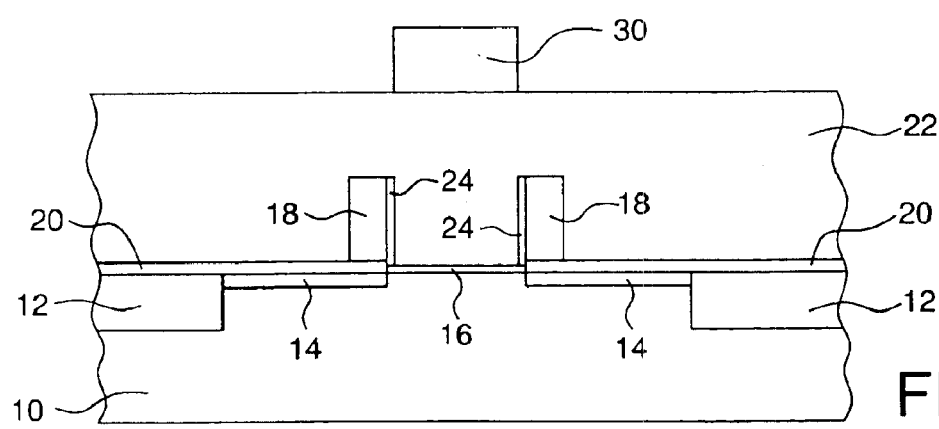
Figure 4:
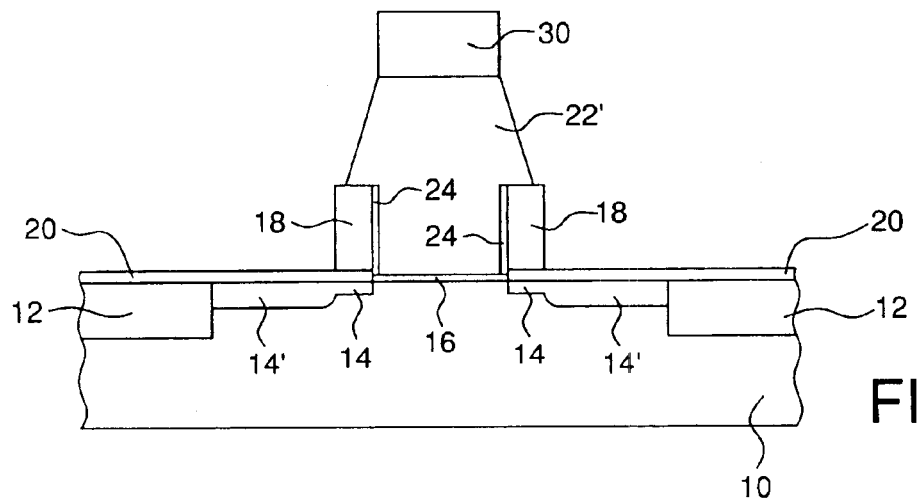

As shown in FIG. 3, a photoresist layer 30 is then formed and patterned over the polysilicon layer 22 in order to mask the region over the gate trench to form the polysilicon gate element of the transistor device. In one exemplary embodiment, the photoresist layer 30 is formed over the gate trench and has a width approximately equal to or greater than the channel length of the transistor, e.g., approximately 0.07 µm or greater for a 0.07 µm gate channel. As shown in FIG. 4, an anisotropic dry etch process, such as a plasma reactive ion etch (RIE), is then employed to etch the polysilicon layer 22 down to the pad oxide layer 20 and to provide a "hatted" polysilicon gate element 22'. The "hatted" polysilicon gate element 22' preferably has a height between about 300–1000 Å. In one exemplary fabrication method, the selected etch process has a trim bias such that the polysilicon gate element 22' has a generally trapezoidal shape above the gate trench with a base portion that at least partially overlaps the spacers 18 and a top portion (parallel to the base portion) that is at least as wide as the gate channel. The hatted gate element 22' is preferably dimensioned to substantially reduce silicide agglomeration. For example, if the silicide contact in the polysilicon gate element (formed as discussed below) is a cobalt silicide contact, tests have shown that a width of at least 0.10 µm is sufficient to substantially prevent silicide agglomeration therein. The height of the element 22' should also be at least 300 Å. The base of the trapezoidal portion of polysilicon gate element 22' preferably overlaps each spacer 18 by about 0.02–0.05 µm, assuming each spacer element 18 has a width of approximately 0.06 µm. As mentioned, regardless of the size of spacers 18, the gate element 22' should be sized to substantially prevent silicide agglomeration therein. After the polysilicon gate element 22' and spacers 18 are formed, a second doping may be employed to form more heavily doped source and drain regions 14', using spacer 18 and polysilicon gate element 22' as implant masks.

Figure 5:
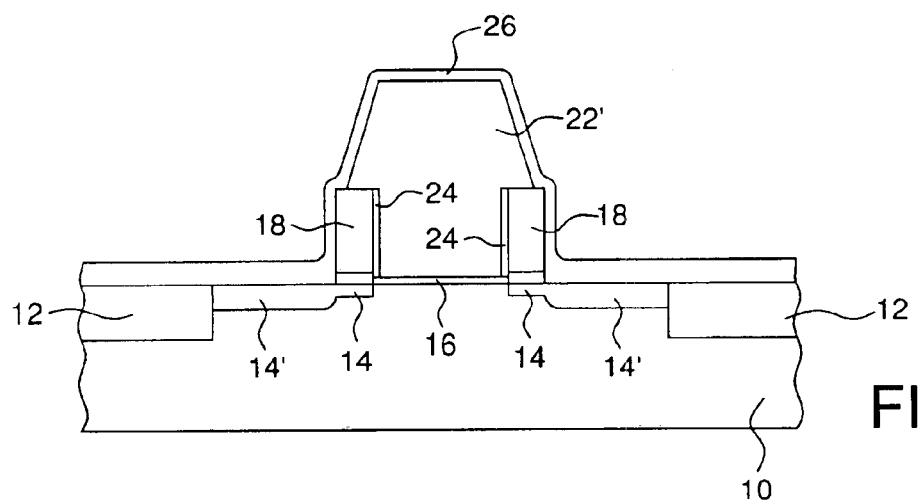
Figure 6:
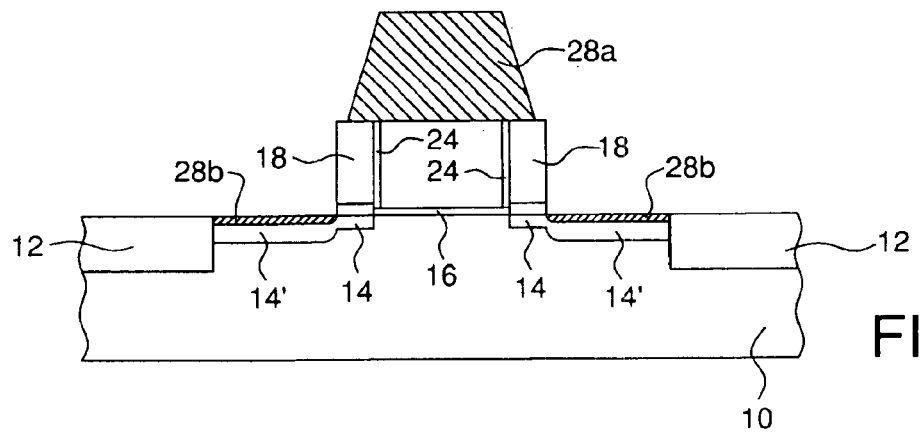

Referring to FIG. 5, after the hatted polysilicon gate element 22' is formed, the exposed pad oxide layer 20 is removed in areas where silicide contact regions in the source and drain regions are to be formed, and a layer of a refractory metal, such as titanium, nickel, tantalum or cobalt, which is preferred for 0.07 µm and smaller gate structures, is deposited. The structure is then processed per conventional salicidation techniques to form silicide contact regions 28a in the hatted trapezoidal portion of the polysilicon gate element 22' and silicide contact regions 28b to the source and drain regions, as shown in FIG. 6. Briefly, after the metal layer 26 is deposited, a first rapid thermal anneal may be employed to react the silicon and refractory metal to form silicide regions. The unreacted metal is then removed, and a second rapid thermal anneal is employed to complete formation of the silicide regions.

The generally trapezoidal "hat" of the polysilicon gate 22' increases the effective area in the polysilicon gate for silicide grain growth during silicide formation. The expanded top portion helps to prevent silicide agglomeration in the silicide regions, thereby maintaining or reducing electrode resistance, improving high-frequency performance, and reducing gate delay in sub micron FET ULSI devices, without increasing the underlying active channel length, i.e., the electrode length is expanded without expanding the control length. As described above, the process is generally compatible with conventional self-aligned gate processes and methods as well as damascene techniques.

Figure 7:
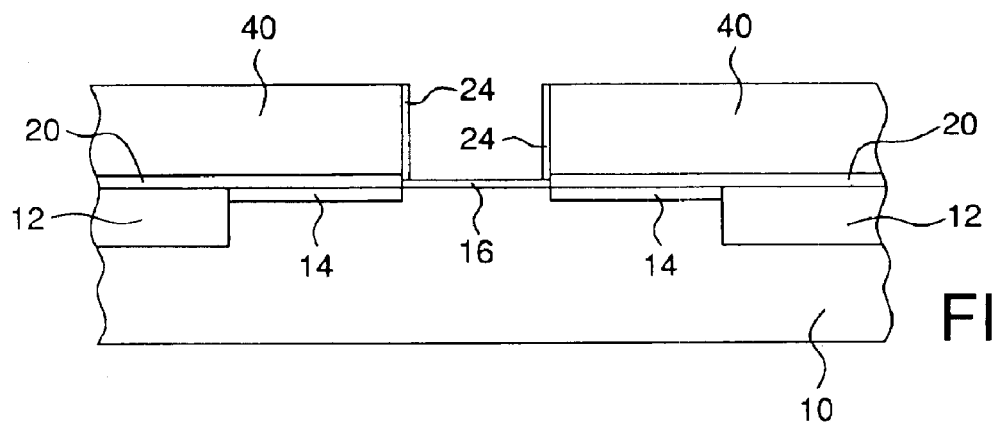
FIGS. 7–12A are cross-sections of a partially manufactured semiconductor device illustrating a second exemplary salicide method and structure for improving contact performance.
Figure 8:
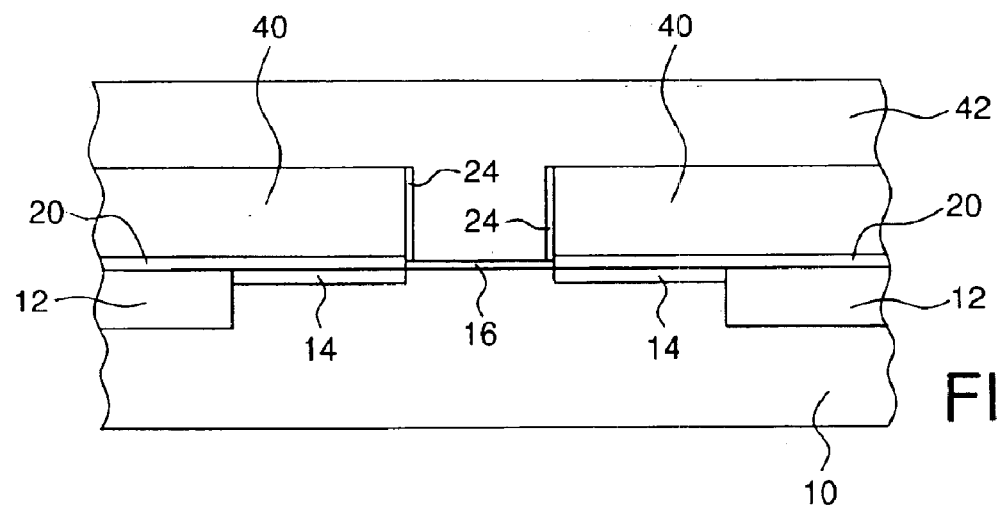

FIGS. 7–12A illustrate another exemplary method of improving salicide contact performance and an exemplary salicided gate element structure. Referring first to FIG. 7, the same partially finished semiconductor device as shown in FIG. 1 is provided, only the spacers of the transistor device are not yet formed. Rather, a layer of spacer material 40, e.g., SiN, having a thickness of about 500–1200 Å or greater, is provided over the substrate and etched to form the gate trench region, which has gate dielectric layer 16 formed therein. Referring to FIG. 8, a layer of polysilicon 42 having a thickness between approximately 3000–8000 Å is then deposited to fill the gate trench region and cover the layer of spacer material 40. The polysilicon layer 42 is then polished to planarize the top surface of the polysilicon layer 42 to a total thickness (from the bottom of the gate trench to the top surface of the layer 42) of between about 1000–1800 Å.

Figure 9:
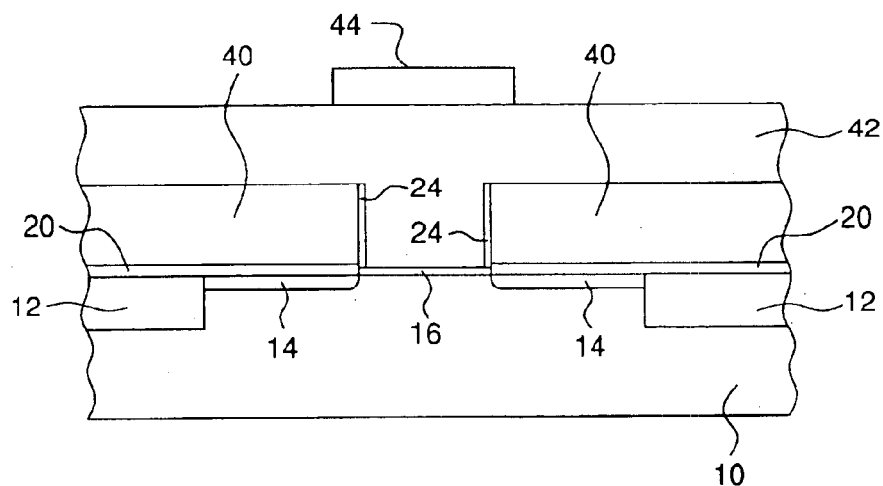
Figure 10:
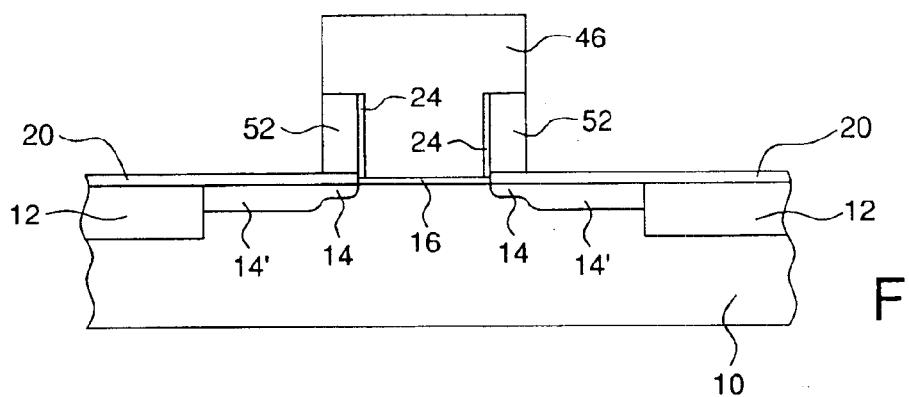
Figure 10A:
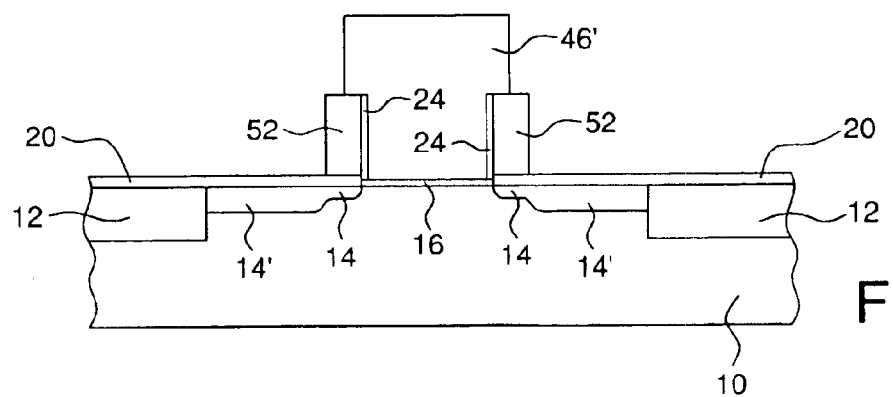

As shown in FIG. 9, after planarizing the polysilicon layer 42, an appropriately patterned photoresist 44 is formed over the gate trench region. The photoresist is preferably sized, and an etch process is selected, to form spacers 52 and to provide either the T-shaped polysilicon gate element 46 of FIG. 10, which completely overlaps vertical spacers 52, or T-shaped polysilicon gate element 46' of FIG. 10A, which only partially overlaps vertical spacers 52. The etch process can generally be controlled via process conditions familiar to those in the processing art to have a trim bias between approximately 0.00–0.03 µm. Assuming the total width of the spacers 42 and gate trench is approximately 0.19 µm (with each vertical spacer having a width of approximately 0.06 µm and a transistor channel width of 0.07 µm), then the photoresist 46 should have a width in the range of 0.11–0.22 µm in order to provide between 0.02 to 0.06 µm of polysilicon overlap for each spacer 52. Regardless of the overlap, the top portion of the gate element 46, 46' should have a width sufficient to substantially prevent silicide agglomeration. One advantage of this fabrication technique is that the spacers 42 and hatted polysilicon gate 46, 46' can be formed during the same etch process.

Figure 11:
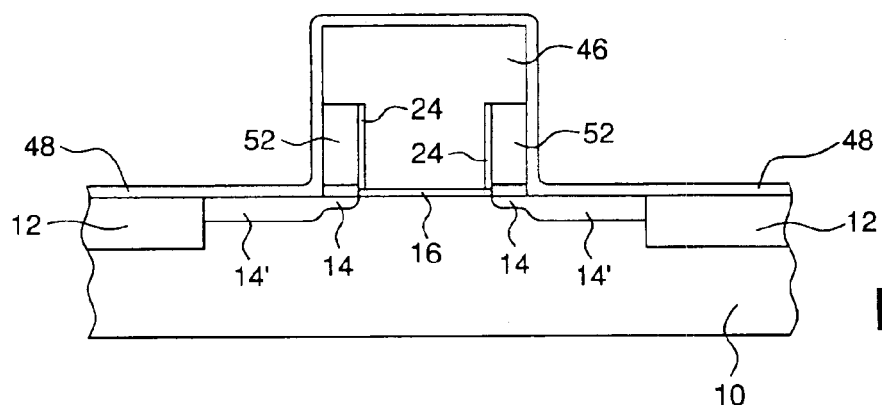
Figure 11A:
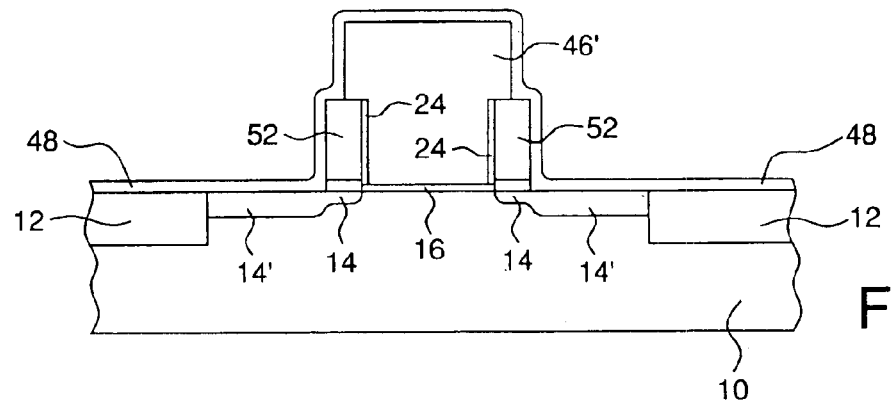
Figure 12:
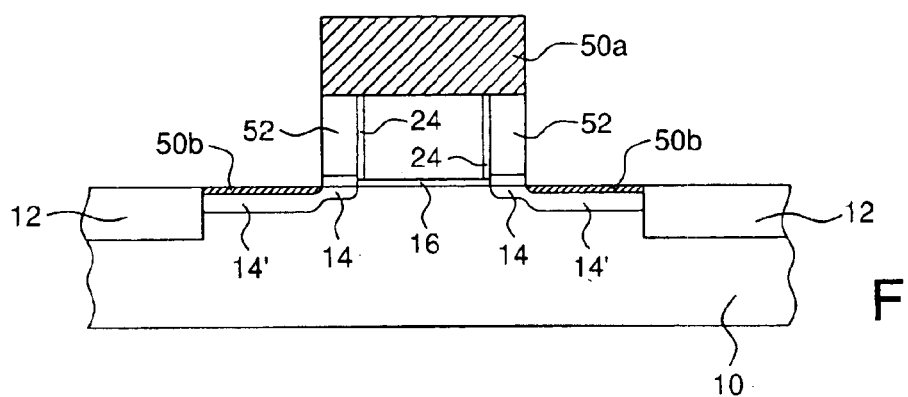
Figure 12A:
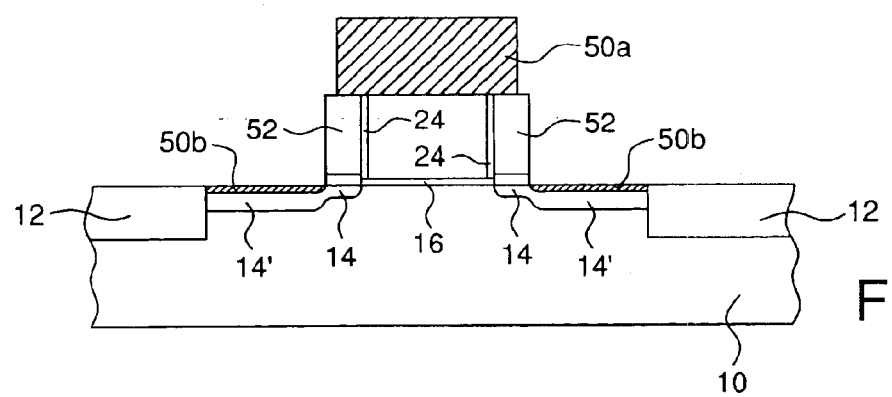

After the T-shaped polysilicon gate element 46 or 46' and spacers 52 are formed as described above in connection with FIGS. 7–10A, a second doping step may be employed to form more heavily doped source and drain regions 14'. Thereafter, silicide contact regions are formed. As shown in FIG. 11 and FIG. 11A, pad oxide layer 20 is removed to expose the silicon source and drain regions. A layer of a refractory metal 48, preferably cobalt for 0.07 µm gate structures and below, is then deposited. Conventional salicidation process steps are then employed to form silicide contact regions 50a in the T-shaped polysilicon gate element 46 or 46' and silicide contact regions 50b in the source and drain regions.

The polysilicon gate element 46', where the polysilicon element only partially overlaps the vertical side spacers 52, may be preferred in order to provide additional spacing or isolation between the gate element silicide contact 50a and the source and drain silicide contacts 50b.

It should be apparent that, like the silicide contact 28a of the polysilicon gate of FIG. 6, the silicide contact 50a of the T-shaped hatted polysilicon gate elements 46, 46' increases the effective area in the polysilicon gate element for silicide grain growth during silicide formation. This in turn helps to prevent silicide agglomeration in the silicide region of the polysilicon gate elements and thereby reduces sheet resistance. In an exemplary embodiment, line width gain is provided between about 0.04 and 0.12 µm. As mentioned, the gate element can be dimensioned to substantially prevent silicide agglomeration. By preventing silicide agglomeration in the silicide regions, the expanded top portion maintains or reduces electrode resistance, improves high-frequency performance, and reduces gate delay in sub micron FET ULSI devices, without increasing the underlying active channel length, i.e., the electrode length is expanded without expanding the control length. As described above, the process is generally compatible with conventional self-aligned gate processes and methods as well as damascene techniques.

Although the invention has been described in terms of exemplary embodiments, it is not limited thereto. Rather, the appended claims should be construed broadly to include other variants and embodiments of the invention that may be made by those skilled in the art without departing from the scope and range of equivalents of the invention.

What is claimed is:

1. A method of forming a low resistance salicided gate structure of a field effect transistor, comprising the following steps:
    forming a pair of vertical spacers over a substrate, said spacers defining a gate trench region having a gate dielectric layer formed therein;
    depositing a blanket layer of polysilicon over said spacers and in said gate trench region;
    planarizing said deposited layer of polysilicon;
    selectively etching said planarized polysilicon layer to form a polysilicon gate element having a generally trapezoidal shaped polysilicon region over said gate trench, wherein a base of said trapezoidal region at least partially overlaps said spacers; and
    forming a silicide contact in said trapezoidal region.

2. The method of claim 1, wherein said silicide formation step includes the step of depositing a refractory metal layer over said trapezoidal shaped polysilicon region and processing said refractory metal layer to form said silicide contact.

3. The method of claim 2, wherein said trapezoidal region is sized to substantially prevent silicide agglomeration in said silicide contact.

4. The method of claim 3, wherein said metal layer includes tantalum, tungsten, titanium, cobalt or nickel.

5. The method of claim 1, wherein a top portion of said trapezoidal region has a width that is greater than or equal to a channel length of said transistor.

6. The method of claim 5, wherein said channel length is less than or equal to approximately 0.07 µm and said silicide contact includes cobalt silicide.

7. The method of claim 6, wherein said top portion has as width that is at least about 0.10 µm.

8. A method of forming a low resistance salicided gate structure of a field effect transistor, comprising the following steps:
    etching an insulating layer deposited over a substrate to define a gate trench region of said transistor, said gate trench region having a gate dielectric layer formed therein;
    depositing a blanket layer of polysilicon over said insulating layer and within said gate trench region;
    planarizing said blanket layer of polysilicon;
    etching said planarized layer of polysilicon and said insulating layer to form a generally T-shaped polysilicon gate element and a pair of vertical spacers including a portion of said insulating layer, said generally T-shaped polysilicon gate element at least partially overlapping said spacers; and
    forming a silicide contact in a top portion of said T-shaped polysilicon gate element.

9. The method of claim 8, wherein said silicide formation step includes the step of depositing a refractory metal layer over said polysilicon gate element and processing said metal layer to form said silicide contact.

10. The method of claim 9, wherein a top portion of said polysilicon gate element is sized to substantially prevent silicide agglomeration in said silicide contact.

11. The method of claim 10, wherein said metal layer includes tantalum, tungsten, titanium, cobalt or nickel.

12. The method of claim 8, wherein said transistor has a channel length that is less than or equal to about 0.07 µm and said silicide contact includes cobalt silicide.

13. The method of claim 12, wherein said top portion has a width that is greater than or equal to about 0.10 µm.

14. The method of claim 13, wherein said top portion only partially overlaps said vertical spacers.

15. The method of claim 14, wherein said top portion overlaps each of said vertical spacers between about 0.02–0.05 µm.

16. A method of forming a low resistance salicided gate structure of a field effect transistor, comprising the following steps:
    forming a pair of vertical spacers over a substrate, said spacers defining a gate trench region having a gate dielectric layer formed therein;
    depositing a blanket layer of polysilicon over said spacers and in said gate trench region;
    planarizing said deposited layer of polysilicon;
    selectively etching said planarized polysilicon layer to form a polysilicon gate element having a generally trapezoidal shaped polysilicon region over said gate trench, wherein a base of said trapezoidal region at least partially overlaps each of said spacers; and
    depositing a layer of cobalt over said trapezoidal region and processing said cobalt layer to form a cobalt silicide contact in said trapezoidal region,
    wherein said trapezoidal region is sized to substantially prevent silicide agglomeration in said cobalt silicide contact.

17. The method of claim 16, wherein a top portion of said trapezoidal region has a width that is greater than or equal to a channel length of said transistor.

18. The method of claim 17, wherein said channel length is less that or equal to about 0.07 μm, and a top portion and said base of said trapezoidal region have respective widths that are greater than at least about 0.10 μm.

19. A method of forming a low resistance salicided gate structure of a field effect transistor, comprising the following steps:

etching an insulating layer deposited over a substrate to define a gate trench region of said transistor, said gate trench region having a gate dielectric layer formed therein;

depositing a blanket layer of polysilicon over said insulating layer and within said gate trench region;

planarizing a top surface of said blanket layer of polysilicon;

etching said planarized layer of polysilicon and said insulating layer to form a generally T-shaped polysilicon gate element and a pair of vertical spacers including a remaining portion of said insulating layer, a top portion of said T-shaped polysilicon gate element at least partially overlapping each of said spacers; and depositing a layer of cobalt over said T-shaped polysilicon gate element and processing said cobalt layer to form a cobalt silicide contact in the top portion of said polysilicon gate element, wherein said top portion is sized to substantially prevent silicide agglomeration in said cobalt silicide contact.

20. The method of claim 19, wherein said transistor has a channel length that is less than or equal to about 0.07 μm and said top portion has a width that is greater than or equal to 0.10 μm.

21. The method of claim 20, wherein said top portion only partially overlaps said vertical spacers.

22. The method of claim 21, wherein said top portion overlaps each of said vertical spacers between about 0.02–0.05 μm.

* * * * *